(12) United States Patent
Nesori

(10) Patent No.: US 10,957,351 B2
(45) Date of Patent: Mar. 23, 2021

(54) MICROACTUATOR, HEAD SUSPENSION ASSEMBLY AND DISK DEVICE

(71) Applicants: Kabushiki Kaisha Toshiba, Tokyo (JP); Toshiba Electronic Devices & Storage Corporation, Tokyo (JP)

(72) Inventor: Hirofumi Nesori, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/522,705

(22) Filed: Jul. 26, 2019

(65) Prior Publication Data
US 2020/0286511 A1     Sep. 10, 2020

(30) Foreign Application Priority Data
Mar. 4, 2019   (JP) .............................. JP2019-038826

(51) Int. Cl.
*G11B 5/48*         (2006.01)
*H01L 41/09*        (2006.01)
*H01L 41/047*       (2006.01)

(52) U.S. Cl.
CPC .......... *G11B 5/4833* (2013.01); *G11B 5/4813* (2013.01); *G11B 5/4873* (2013.01); *H01L 41/0472* (2013.01); *H01L 41/0986* (2013.01)

(58) Field of Classification Search
None
See application file for complete search history.

(56) References Cited

U.S. PATENT DOCUMENTS

| 6,747,400 | B2* | 6/2004 | Maichl ................ H01L 41/0533 |
| | | | 310/330 |
| 8,471,440 | B2* | 6/2013 | Nakatani .............. G11B 5/4873 |
| | | | 310/328 |
| 8,593,765 | B2* | 11/2013 | Uematsu .............. G11B 5/4873 |
| | | | 360/234.5 |
| 8,737,021 | B2 | 5/2014 | Yonekura et al. |
| 9,299,908 | B2 | 3/2016 | Nakamura et al. |
| 9,330,698 | B1* | 5/2016 | Hahn ................... G11B 5/4806 |
| 10,236,022 | B2* | 3/2019 | Ee ............................ G11B 5/56 |
| 2011/0084571 | A1* | 4/2011 | Nakatani .............. G11B 5/4833 |
| | | | 310/328 |

(Continued)

FOREIGN PATENT DOCUMENTS

| GB | 1382326 | A | * | 1/1975 | .......... H01L 41/107 |
| JP | 2015082328 | A | * | 4/2015 | |

*Primary Examiner* — William J Klimowicz
(74) *Attorney, Agent, or Firm* — White & Case LLP

(57) ABSTRACT

According to one embodiment, a microactuator includes a wiring substrate, and a piezoelectric element connected to first and second connecting pads of the wiring substrate. The piezoelectric element includes a piezoelectric substrate, and a first electrode and a second electrode provided on surfaces of the piezoelectric substrate. The first electrode includes a first electrode portion on an end portion on a first main surface. The second electrode includes a fifth electrode portion having an electrode end which faces the first electrode portion across a gap and provided on the first main surface. The piezoelectric element includes a protective insulating layer covering at lease an end portion of the fifth electrode including the electrode end.

9 Claims, 11 Drawing Sheets

(56) References Cited

U.S. PATENT DOCUMENTS

| | | | |
|---|---|---|---|
| 2011/0149440 A1* | 6/2011 | Uematsu | G11B 5/4873 |
| | | | 360/245.3 |
| 2014/0168815 A1* | 6/2014 | Kudo | G11B 5/4873 |
| | | | 360/99.08 |
| 2019/0214042 A1* | 7/2019 | Ee | G11B 5/4873 |
| 2019/0228796 A1* | 7/2019 | Ee | G11B 5/4833 |
| 2020/0091404 A1* | 3/2020 | Zhang | H01L 41/0472 |

* cited by examiner

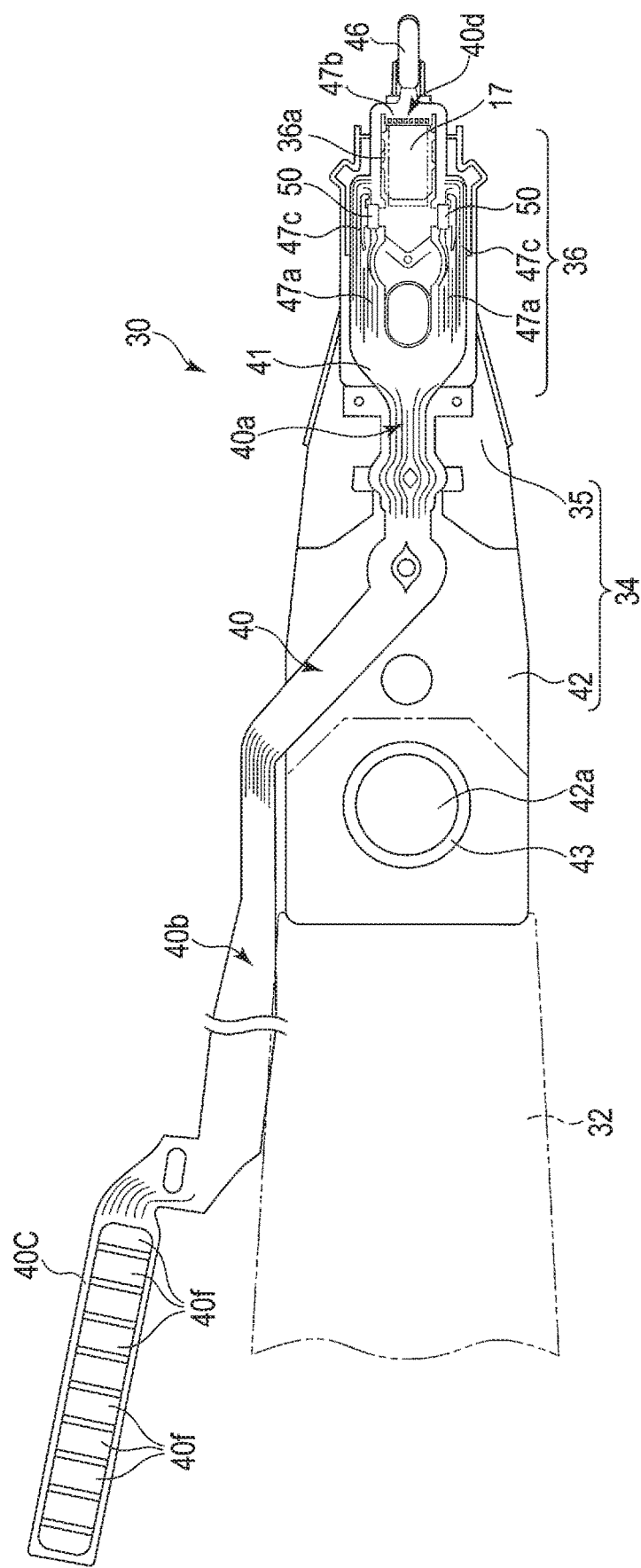
F I G. 2

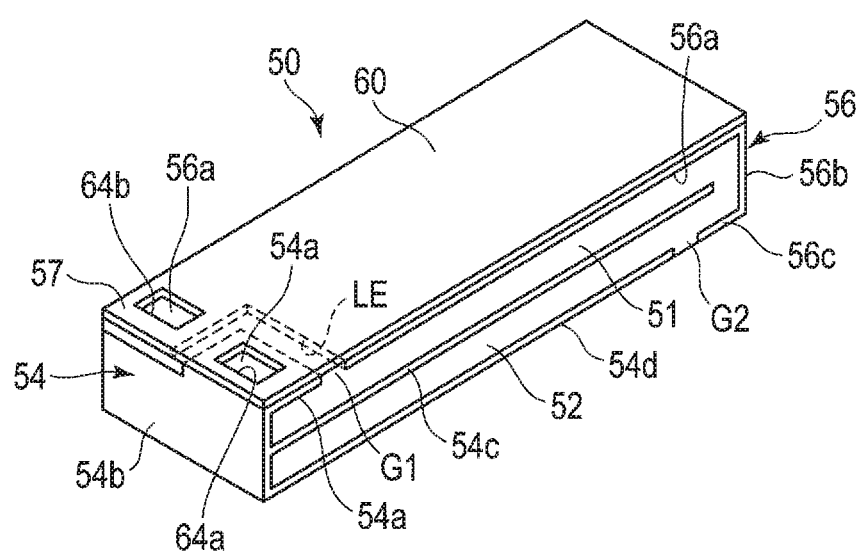
F I G. 17

MICROACTUATOR, HEAD SUSPENSION ASSEMBLY AND DISK DEVICE

CROSS-REFERENCE TO RELATED APPLICATIONS

This application is based upon and claims the benefit of priority from Japanese Patent Application No. 2019-038826, filed Mar. 4, 2019, the entire contents of which are incorporated herein by reference.

FIELD

Embodiments described herein relate generally to a microactuator comprising a piezoelectric element, a head suspension assembly with the microactuator, and a disk device comprising the same.

BACKGROUND

As the disk device, for example, a hard disk drive (HDD) comprises a plurality of magnetic disks which are rotatably provided in a housing, a plurality of magnetic heads which read information from or write information to the magnetic disks, and a head actuator which supports the magnetic heads to be movable with respect to the magnetic disks.

The head actuator comprises a plurality of head suspension assemblies which support the magnetic heads, respectively, at its distal end portion. Each head suspension assembly comprises a base plate fixed to an arm at one end, a load beam extending from the base plate, and a flexure (wiring member) provided on the load beam and the base plate. The flexure comprises a displaceable gimbal portion, and the magnetic head is supported on the gimbal portion.

Recently, a head suspension assembly comprising a piezoelectric element constituting a microactuator has been proposed. The piezoelectric element is mounted on the flexure. A pair of electrodes of the piezoelectric element are electrically and mechanically connected respectively to conductive patterns, for example, conductive pads of the flexure, for example, by a conductive adhesive material.

In the microactuator of the HDD described above, it is preferable to increase the amount of expansion/contraction displacement of the piezoelectric element and increase the amount of position adjustment by the actuator. To increase the amount of displacement, the facing area of the pair of electrodes of the piezoelectric element needs to be increased. In this case, however, the electrodes are brought closer to each other, and when connected to the conductive pads, the electrodes may be shorted by the conductive adhesive material. To prevent this, the gap between the electrodes needs to be increased, but this may prevent the increase of the amount of displacement of the piezoelectric element.

BRIEF DESCRIPTION OF THE DRAWINGS

FIG. 2 is a plan view of a head suspension assembly of the HDD.

FIG. 17 is a perspective view showing a piezoelectric element of an HDD according to the fifth modification example.

DETAILED DESCRIPTION

Figure 1:
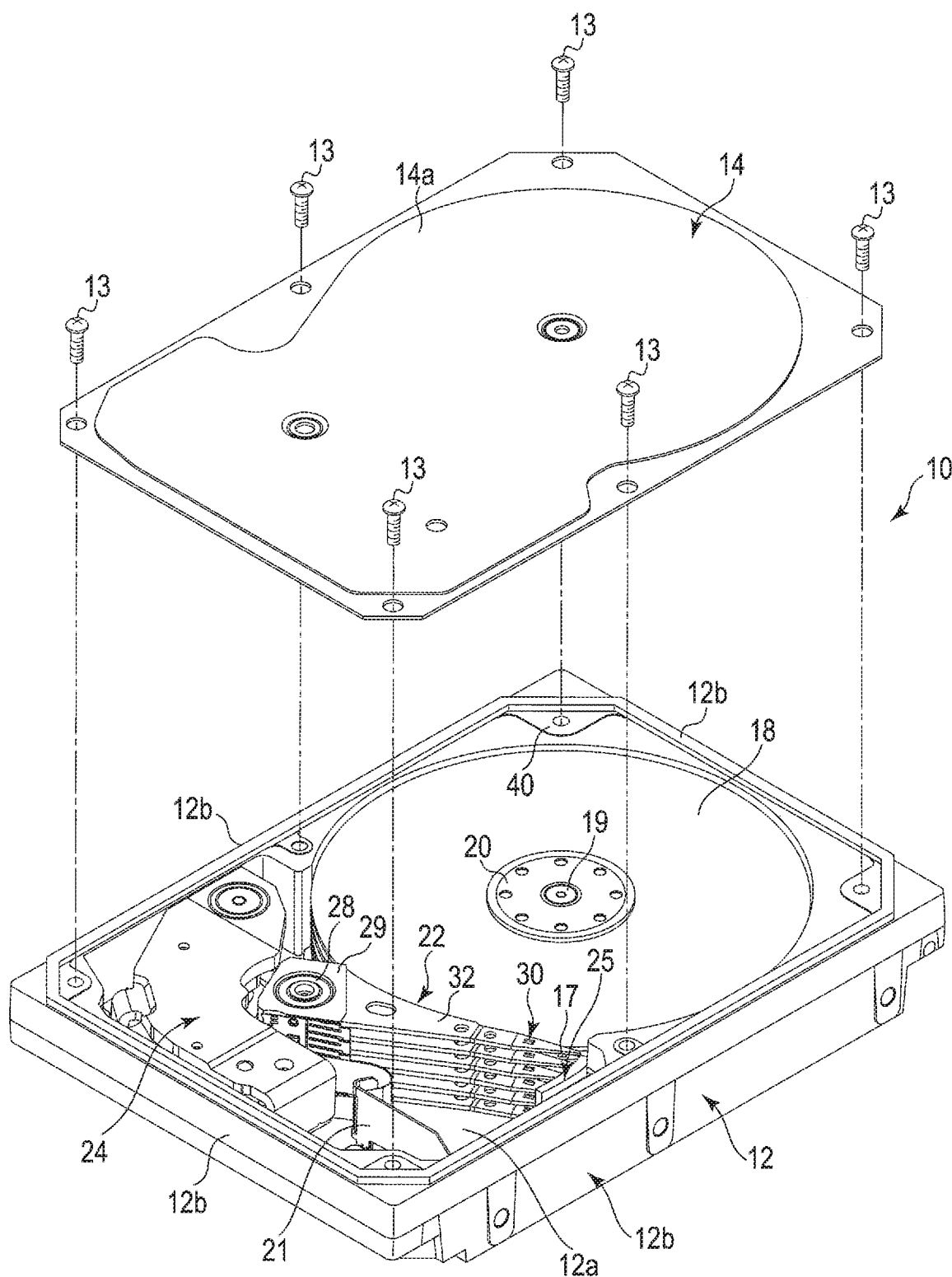
FIG. 1 is an exploded perspective view of a hard disk drive (HDD) of an embodiment.

Various embodiments will be described hereinafter with reference to the accompanying drawings. In general, according to one embodiment, a microactuator comprises a wiring substrate comprising a first connecting pad and a second connecting pad, and a piezoelectric element mounted on the wiring substrate and connected to the first connecting pad and the second connecting pad. The piezoelectric element comprises a piezoelectric substrate formed of a piezoelectric material, a first electrode, a second electrode, and a protective insulating layer. The piezoelectric substrate includes a first main surface, a second main surface opposite to the first main surface, and a first side surface and a second side surface facing each other. The first electrode comprises a first electrode portion provided on an end portion on a first side surface side of the first main surface, a second electrode portion provided on the first side surface, and a third electrode portion provided on the second main surface. The second electrode comprises a fifth electrode portion which is provided on the first main surface, has an electrode end facing the first electrode portion across a gap, and opposes the third electrode portion via the piezoelectric substrate, and a sixth electrode portion provided on the second side surface. The protective insulating layer covers an end portion of the fifth electrode portion including at least the electrode end. The piezoelectric element is arranged such that the first main surface faces the wiring substrate. The first electrode and the second electrode are connected to the first connecting pad and the second connecting pad, respectively, by a conductive adhesive material.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by the same reference numbers, and detailed description thereof is omitted unless necessary.

Embodiment

As a disk device, a hard disk drive (HDD) according to an embodiment will be described in detail.

FIG. 1 is an exploded perspective view of the HDD according to the embodiment from which a cover is removed. As shown in the drawing, the HDD comprises a rectangular housing 10. The housing 10 comprises a base 12 having the shape of a rectangular box which is open on its upper surface side, and a cover (top cover) 14. The base 12 comprises a rectangular bottom wall 12a, and sidewalls 12b standing along the peripheral edges of the bottom wall 12a, and is integrally formed of, for example, aluminum. The cover 14 has the shape of a rectangular plate and is formed of, for example, stainless steel. The cover 14 is screwed on the sidewalls 12b of the base 12 by a plurality of screws 13, and hermetically closes the upper opening of the base 12.

Several, for example, five magnetic disks 18 as disk-shaped recording media, and a spindle motor 19 which supports and rotates the magnetic disks 18 are provided in the housing 10. The spindle motor 19 is provided on the bottom wall 12a.

Each magnetic disk 18 has the shape of a disk having a diameter of, for example, 95 mm (3.5 inches) and comprises a magnetic recording layer on its upper surface and/or lower surface. The magnetic disks 18 are coaxially engaged with a hub (not shown) of the spindle motor 19, clamped by a clamp spring 20, and thereby fixed to the hub. Consequently, the magnetic disks 18 are supported in a state of being positioned parallel to the bottom wall 12a of the base 12. The magnetic disks 18 are rotated at a predetermined rotation rate by the spindle motor 19.

Although, for example, five magnetic disks 18 are accommodated in the housing 10 in the embodiment, the number of magnetic disks 18 is not limited to five and can be increased or decreased. In addition, a single magnetic disk 18 may be accommodated in the housing 10.

A plurality of magnetic heads 17 (see FIG. 2) which record information on or reproduce information from the magnetic disks 18, and a head actuator 22 which supports the magnetic heads 17 such that the magnetic heads 17 are movable with respect to the magnetic disks 18 are provided in the housing 10. In addition, a voice coil motor (VCM) 24 which rotates and positions the head actuator 22, a ramped loading mechanism 25 which holds the magnetic heads 17 at an unloading position away from the magnetic disks 18 when the magnetic heads 17 are moved to the outermost circumferences of the magnetic disks 18, and a wiring substrate unit (FPC unit) 21 on which an electronic component such as a conversion connector is mounted are provided in the housing 10.

The head actuator 22 comprises an actuator block 29 in which a bearing unit 28 is incorporated, a plurality of arms 32 extending from the actuator block 29, and a plurality of suspension assemblies 30 (referred to also as head gimbal assemblies (HGA)) extending from the respective arms 32. The magnetic head 17 is supported on a distal end portion of each suspension assembly 30. The head actuator 22 is rotatably supported on a pivot shaft standing on the bottom wall 12a via the bearing unit 28.

A printed circuit board (not shown) is screwed on the outer surface of the bottom wall 12a. A control unit is formed on the printed circuit board, and the control unit controls the operation of the spindle motor 19 and controls the operations of the VCM 24 and the magnetic heads 17 via the wiring substrate unit 21.

Next, the configuration of the suspension assembly 30 will be described in detail.

Figure 3:
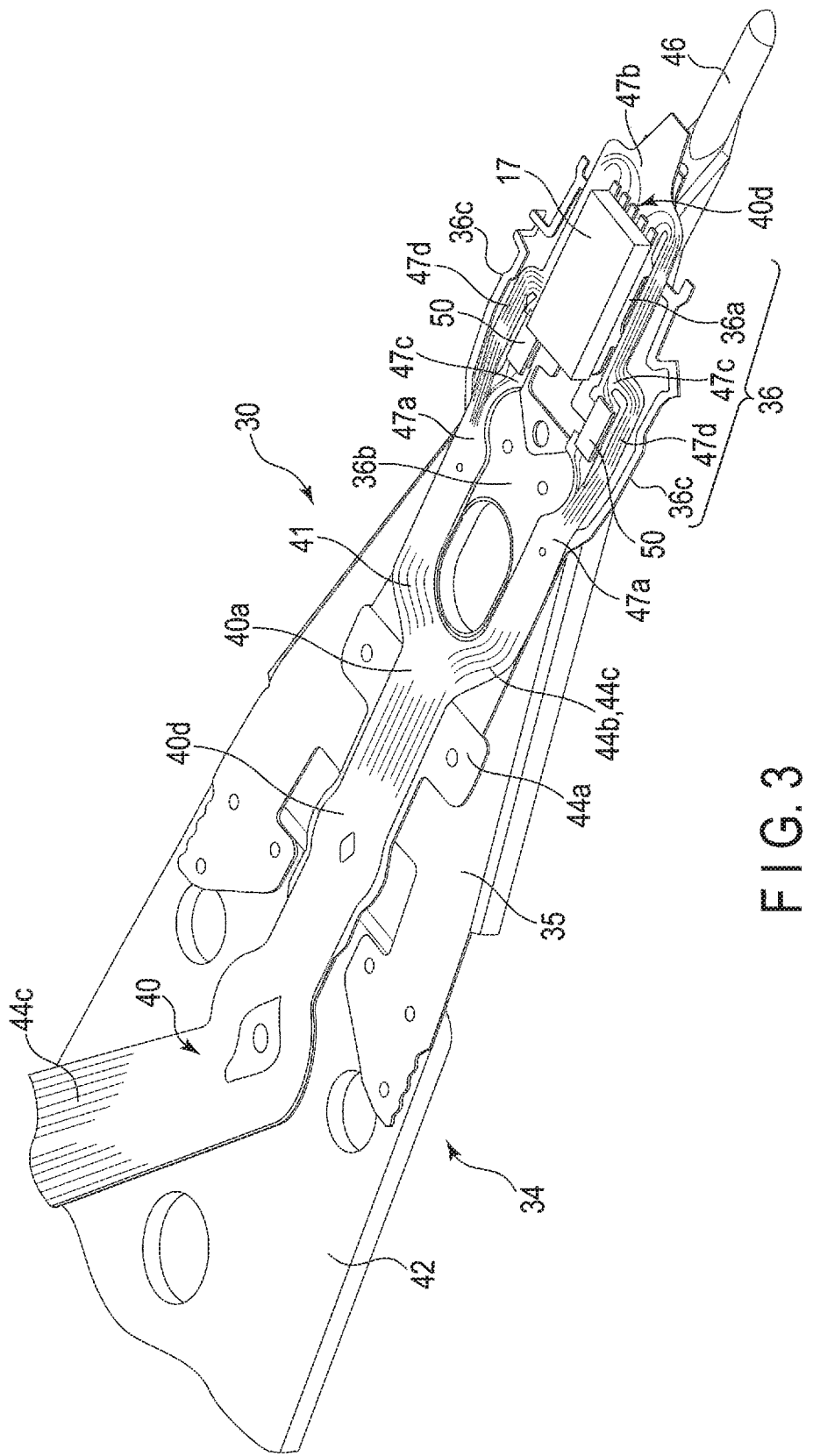
FIG. 3 is a perspective view of the head suspension assembly.

FIG. 2 is a plan view of the suspension assembly, and FIG. 3 is a perspective view of the suspension assembly.

As shown in FIGS. 2 and 3, each suspension assembly 30 comprises a suspension 34 extending from the arm 32, and the magnetic head 17 is attached to a distal end portion of the suspension 34. Note that the magnetic head 17 and the suspension assembly 30 which supports the magnetic head 17 are collectively called a head suspension assembly.

The suspension 34 functioning as a supporting plate comprises a base plate 42 which has a rectangular shape and is formed of a metal plate having a thickness of several hundreds of microns, and a load beam 35 which has the shape of a thin plate spring and is formed of a metal plate having a thickness of several tens of micros. In the load beam 35, its proximal end portion is overlaid on a distal end portion of the base plate 42 and is fixed to the base plate 42 by welding a plurality of portions. The width of the proximal end portion of the load beam 35 is substantially the same as the width of the base plate 42. A rod-shaped tab 46 projects from the distal end of the load beam 35.

The base plate 42 comprises a circular opening 42a in its proximal end portion, and a ring-shaped projection 43 around the opening. The base plate 42 is fastened to a distal end portion of the arm 32 by fitting the projection 43 into a circular swaging hole (not shown) formed in a swaging bearing surface of the arm 32, and swaging the projection 43. The proximal end of the base plate 42 may be fixed to the distal end of the arm 32 by laser welding, spot welding or bonding.

The suspension assembly 30 comprises a flexure (wiring member, wiring substrate) 40 having the shape of a long and thin belt for transmitting a recording signal and a reproduction signal and a driving signal of piezoelectric elements 50, and the pair of piezoelectric elements (for example, PZT elements) 50 mounted on the flexure 40. The flexure 40 and the piezoelectric elements 50 constitute a microactuator which oscillates the magnetic head 17.

In the flexure 40, as shown in FIG. 2, a distal end side portion 40a is arranged on the load beam 35 and the base plate 42, and a posterior half portion (extending portion) 40b extends outward from a side edge of the base plate 42 and extends along a side edge of the arm 32. A connecting end portion 40c located at the distal end of the extending portion 40b comprises a plurality of connecting pads 40f. These connecting pads 40f are connected to a main FPC of the wiring substrate unit 21 described above.

A distal end portion of the flexure 40 is located on a distal end portion of the load beam 35 and constitutes a gimbal portion 36 functioning as an elastic supporting portion. The magnetic head 17 is mounted on and fixed to the gimbal portion 36 and is supported on the load beam 35 via the gimbal portion 36. The pair of piezoelectric elements 50 as driving elements are mounted on the gimbal portion 36.

Figure 4:
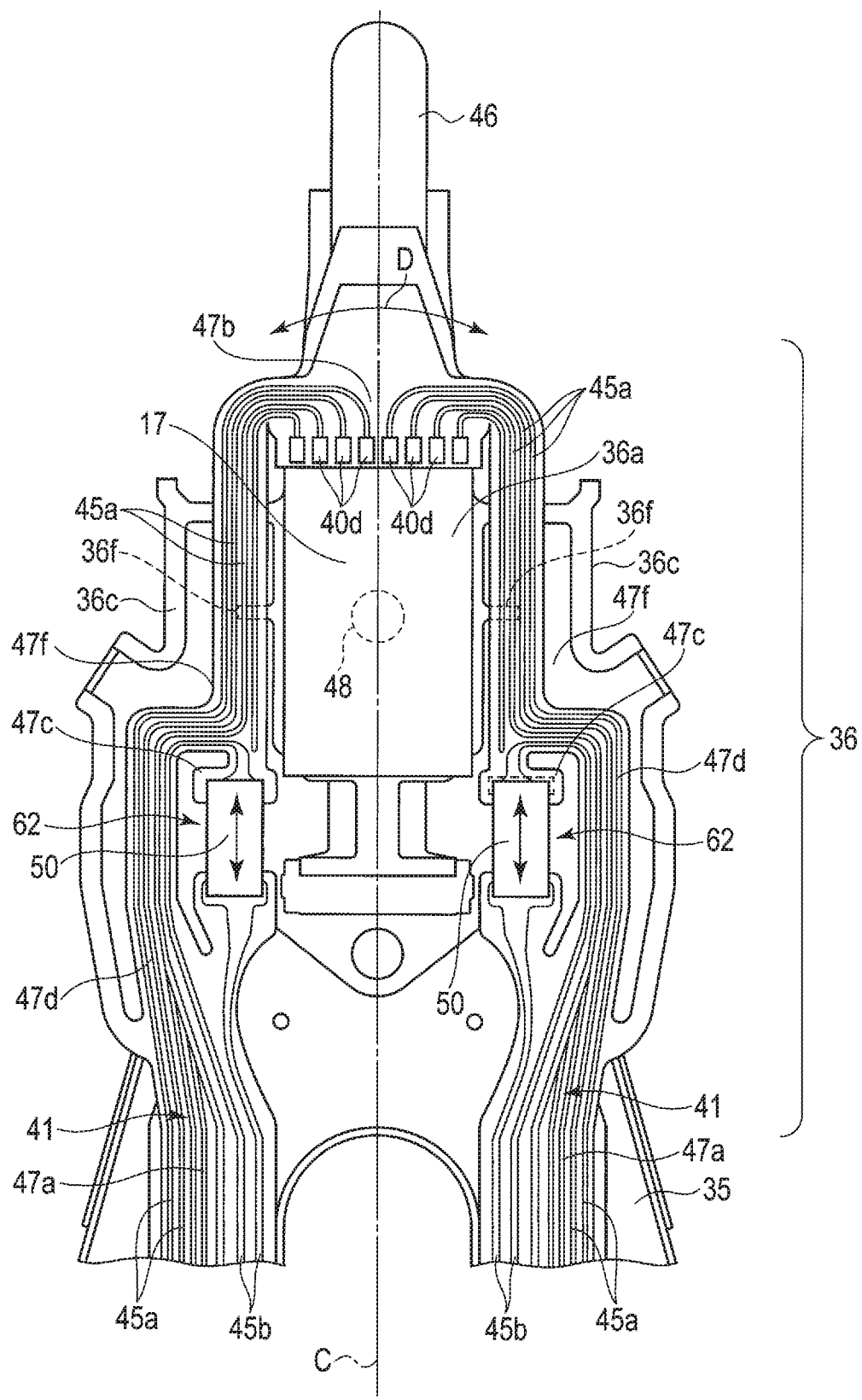
FIG. 4 is an enlarged plan view of a distal end portion of the head suspension assembly.

FIG. 4 is an enlarged plan view of the distal end portion of the suspension assembly 30.

As shown in FIGS. 3 and 4, the flexure 40 comprises a metal sheet (metal plate) 44a formed of stainless steel, etc., as a base, and a belt-shaped multilayer member 41 bonded or fixed to the metal sheet 44a, and constitutes a long and thin multilayer plate. The multilayer member 41 comprises a base insulating layer (first insulating layer) 44b which is mostly fixed to the metal sheet 44a, a conductive layer (wiring pattern) 44c which is formed on the base insulating layer 44b and constitutes a plurality of signal wiring lines 45a, a plurality of driving wiring lines 45b and a plurality of connecting pads, and a cover insulating layer (second insulating layer) 44b which covers the conductive layer 44c and is stacked on the base insulating layer 44b (see FIG. 7). As the conductive layer 44c, for example, a copper foil can be used. In the distal end side portion 40a of the flexure 40, the metal sheet 44a is bonded to the surface of the load beam 35 and the surface of the base plate 42 or welded by spot welding at a plurality of welding points.

In the gimbal portion 36 of the flexure 40, the metal sheet 44a comprises a rectangular tongue portion (supporting portion) 36a located on its distal end side, a substantially-rectangular proximal end portion 36b located on its proximal end side across a gap from the tongue portion 36a, a pair of long and thin outriggers (linking portions) 36c extending from the tongue portion 36a to the proximal end portion 36b, and a pair of handles (supporting projections) 36f projecting from both side edges of the tongue portion 36a to both sides.

The proximal end portion 36b is bonded to the surface of the load beam 35 or fixed to the surface of the load beam 35 by spot welding. The tongue portion 36a has such a size and a shape that the magnetic head 17 can be mounted and has, for example, a substantially-rectangular shape. The tongue portion 36a is arranged such that its central axis in its width direction coincides with a central axis C of the suspension 34. In the tongue portion 36a, its substantially-central portion is in contact with a dimple (convex portion) 48 projecting from the distal end portion of the load beam 35. The tongue portion 36a can be displaced in various directions as the pair of outriggers 36c elastically deform. Consequently, the tongue portion 36a and the magnetic head 17 flexibly follow the surface fluctuation of the magnetic disk 18 in rolling and pitching directions, and thereby maintain a small gap between the surface of the magnetic disk 18 and the magnetic head 17.

In the gimbal portion 36, a part of the multilayer member 41 of the flexure 40 is separated into two parts and is located on both sides of the central axis C of the suspension 34. The multilayer member 41 comprises a proximal end portion 47a fixed to the proximal end portion 36b of the metal sheet 44a, a distal end portion 47b bonded to the tongue portion 36a, a pair of belt-shaped first bridge portions 47c extending from the proximal end portion 47a to the distal end portion 47b, and a pair of belt-shaped second bridge portions 47d arranged alongside the first bridge portions 47c, extending from the proximal end portion 47a to the halfway points of the first bridge portions 47c, and merging with the first bridge portions 47c, respectively. The first bridge portions 47c are located alongside the outriggers 36c on both sides of the tongue portion 36a, and extend in the longitudinal direction of the load beam 35. In addition, the first bridge portions 47c extend over the handles 36f and the crossbars of the outriggers 36c and are partially fixed to them. A part of each first bridge portion 47c constitutes a mounting portion 62 on which the piezoelectric element 50.

The magnetic head 17 is fixed to the tongue portion 36a by adhesive. The magnetic head 17 is arranged such that the central axis in the longitudinal direction coincides with the central axis of the suspension 34, and a substantially-central portion of the magnetic head 17 is located on the dimple 48. A recording element and a reproduction element of the magnetic head 17 are electrically connected to a plurality of electrode pads 40d of the distal end portion 47b by a conductive adhesive material such as solder or silver paste. Consequently, the magnetic head 17 is connected to the signal wiring lines 45a via the electrode pads 40d.

The mounting portion 62 and the piezoelectric element 50 will be described in detail.

Figure 5:
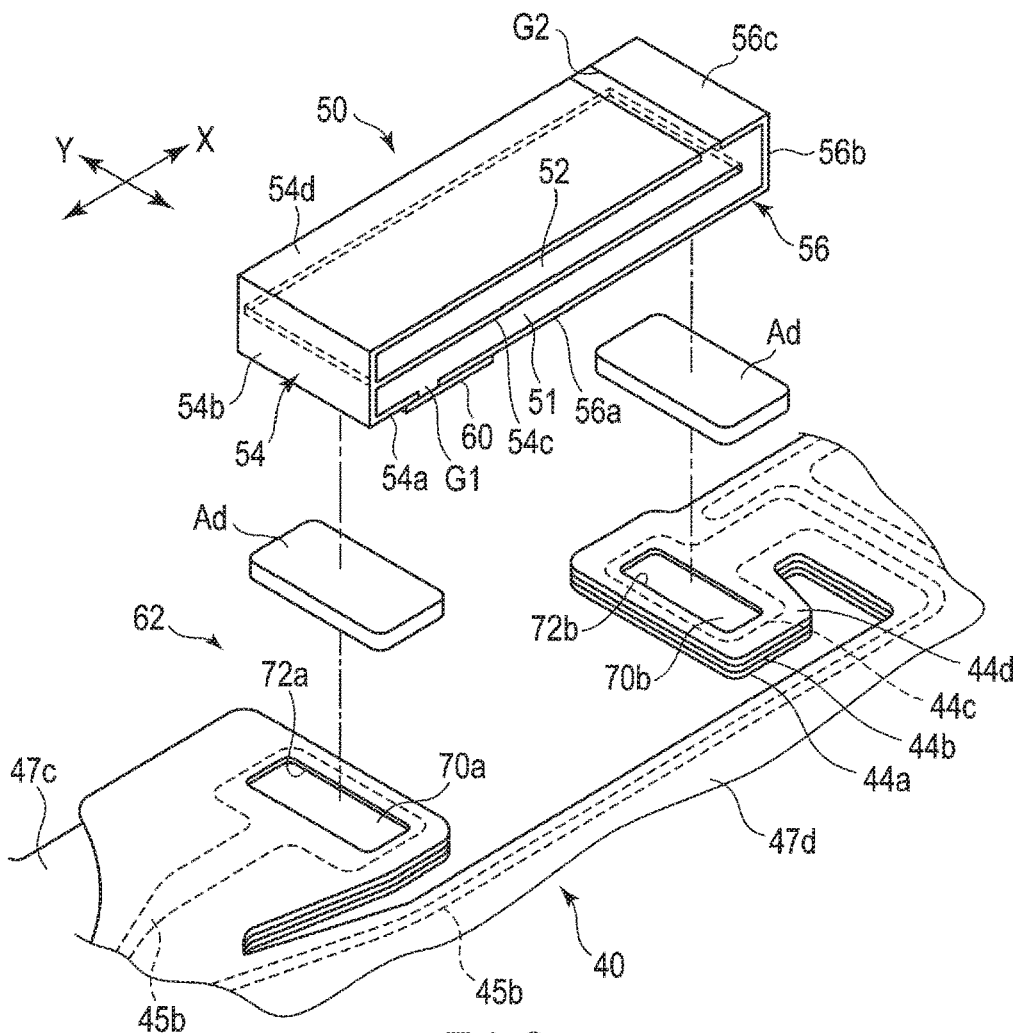
FIG. 5 is an exploded perspective view showing pad portions of a flexure of the head suspension assembly and a piezoelectric element.
Figure 6:
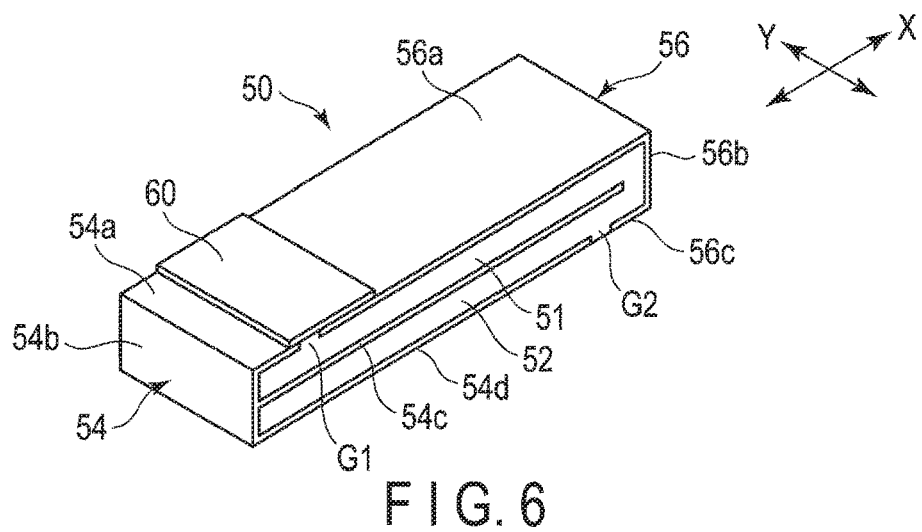
FIG. 6 is a perspective view showing a mounting surface side of the piezoelectric element.
Figure 7:
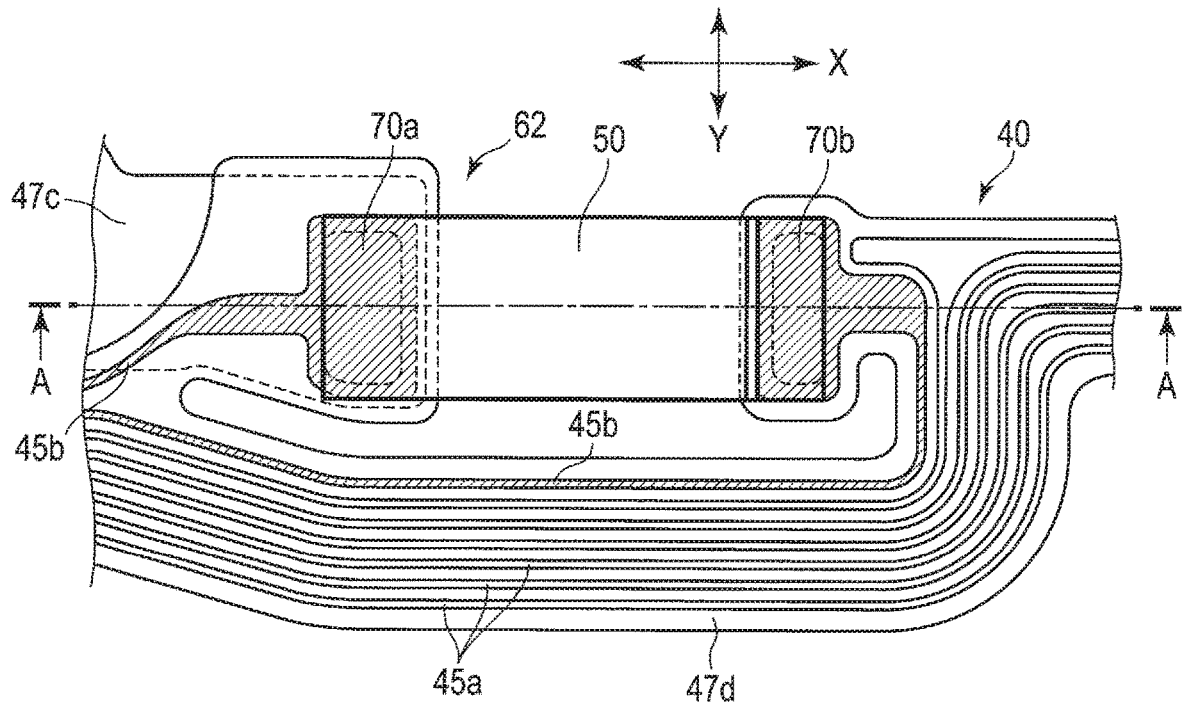
FIG. 7 is a plan view showing the pad portions of the flexure and the piezoelectric element.
Figure 8:
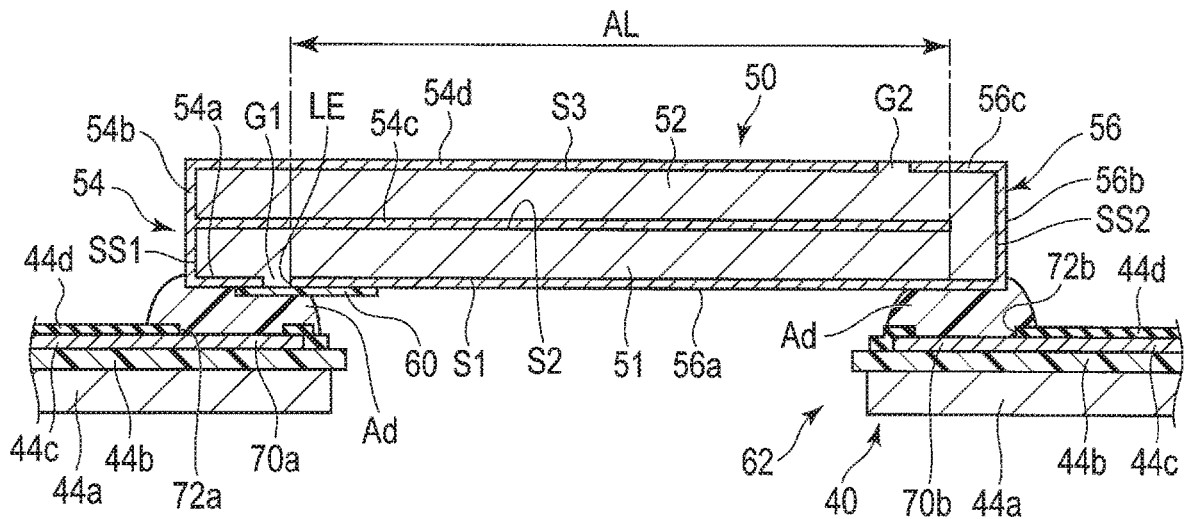
FIG. 8 is a cross-sectional view showing the pad portions and the piezoelectric element along line A-A of FIG. 7.

FIG. 5 is an exploded perspective view showing the mounting portion of the flexure 40 and the piezoelectric element, FIG. 6 is a perspective view showing the lower surface (mounting surface) side of the piezoelectric element, FIG. 7 is a plan view showing the mounting portion on which the piezoelectric element is mounted, and FIG. 8 is a cross-sectional view showing the mounting portion and the piezoelectric element along line A-A of FIG. 7.

As shown in FIG. 5, the mounting portion 62 comprises a first connecting pad 70a and a second connecting pad 70b which are formed of the conductive layer 44c. The first connecting pad 70a and the second connecting pad 70b are electrically continuous with the driving wiring lines 45b formed of the conductive layer 44c. The first connecting pad 70a and the second connecting pad 70b are arranged with a predetermined gap in between in a direction parallel to the central axis C of the load beam 35. In the embodiment, the first bridge portion 47c of the flexure 40 is disconnected between the first connecting pad 70a and the second connecting pad 70b. Consequently, the first connecting pad 70a and the second connecting pad 70b are arranged with a gap of a predetermined length in between.

In the cover insulating layer 44b stacked on the conductive layer 44c, openings 72a and 72b are provided at positions overlapping the first connecting pad 70a and the second connecting pad 70b, respectively. The most part of the first connecting pad 70a and the most part of the second connecting pad 70b are exposed at the outer surface of the cover insulating layer 44b through the openings 72a and 72b, respectively. The first connecting pad 70a and the second connecting pad 70b have a rectangular shape in one example, and similarly, the openings 72a and 72b have a rectangular shape having slightly smaller dimensions than the connecting pads.

In one example, the piezoelectric element 50 comprises a piezoelectric substrate 51 having a rectangular cuboid shape and formed of a piezoelectric material, a first electrode 54 and a second electrode 56 for applying a voltage to the piezoelectric substrate 51, and a protective insulating layer 60 covering at least a region close to an electrode edge of the second electrode 56. The longitudinal direction of the piezoelectric element 50 will be denoted by X, and the width direction orthogonal to this direction X will be denoted by Y. In the embodiment, the piezoelectric element 50 further comprises a confining layer 52 for limiting the sag of the piezoelectric substrate 51. The confining layer 52 has substantially the same dimensions as the piezoelectric substrate 51 and is stacked on the piezoelectric substrate 51. For example, lead zirconate titanate, ceramic or the like is used as the piezoelectric material. In one example, the confining layer 52 is formed of a piezoelectric material similar to that of the piezoelectric substrate 51. The confining layer 52 is not necessarily formed of a piezoelectric material and may be formed of another material.

As shown in FIGS. 5, 6 and 8, the piezoelectric substrate 51 has a first main surface (lower surface) S1, a second main surface (upper surface) S2 facing the first main surface S1, and a pair of shorter side surfaces SS1 and SS2 facing each other. The first electrode 54 is provided from one end portion of the first main surface S1 over one side surface SS1 and the second main surface S2. The second electrode 56 is provided from the first main surface S1 over the other side surface SS2 and a third main surface S3 of the confining layer 52. The first electrode 54 and the second electrode 56 are formed on the surface of the piezoelectric substrate 51 and the confining layer 52 by sputtering, chemical vapor deposition (CVD), spin coating or the like.

The first electrode 54 integrally comprises a first electrode portion 54a provided on one end portion in the longitudinal direction X of the first surface S1, a second electrode portion 54b provided on the side surface SS1, and a third electrode portion 54c provided on the second main surface S2 and extending from one side surface SS1 to a position close to the other side surface SS2. The width in the width direction Y of the first electrode 54 is the same as the width of the piezoelectric substrate 51, and both side edges of the first electrode 54 are aligned with both side edges of the piezoelectric substrate 51. In addition, an edge of the first electrode portion 54a extends substantially parallel to the side surface SS1.

The confining layer 52 overlaps the second main surface of the piezoelectric substrate and the third electrode portion 54c. One end portion of the confining layer 52 is connected to the piezoelectric substrate 51 between the extending end of the third electrode portion 54c and the side surface SS2 of the piezoelectric substrate 51. The confining layer 52 has the third main surface (upper surface) S3 opposing the second main surface S2, and a pair of side surfaces which are aligned with the side surfaces SS1 and SS2 of the piezoelectric substrate 51, respectively.

In the embodiment, the second electrode portion 54b of the first electrode 54 extends on the side surface of the confining layer 52. Furthermore, the first electrode 54 integrally comprises a fourth electrode portion 54d provided on the third main surface S3 and extending from one side surface SS1 to a position close to the other side surface SS2.

On the other hand, the second electrode 56 integrally comprises a fifth electrode portion 56a provided on the first main surface S1, a sixth electrode portion 56b provided on the side surface SS2, and a seventh electrode portion 56c provided on the third main surface S3. The width in the width direction Y of the second electrode 56 is the same as the width of the piezoelectric substrate 51, and both side edges of the second electrode 56 are aligned with both side edges of the piezoelectric substrate 51.

The fifth electrode portion 56a extends from a position close to the first electrode portion 54a to the side surface SS2 and covers almost the entire first main surface S1. On the first main surface S1, an edge (electrode edge LE) of the fifth electrode portion 56a extends substantially parallel to the side surface SS1 and faces an edge of the first electrode portion 54a across a gap (space) G1. The fifth electrode portion 56a faces the third electrode portion 54c via the piezoelectric substrate 51 substantially parallel to the third electrode portion 54c.

The sixth electrode portion 56b is provided over the side surface SS2 and a side surface of the confining layer 52. The seventh electrode portion 56c extends from a side surface to a position close to the fourth electrode portion 54d, on the third main surface S3. On the third main surface S3, an edge of the seventh electrode portion 56c extends substantially parallel to the side surface SS2 and faces an edge of the fourth electrode portion 54d across a gap (space) G2.

As shown in FIGS. 5, 6 and 8, the protective insulating layer 60 has, for example, a rectangular shape and has the same width as the first main surface S1. The protective insulating layer 60 is formed of, for example, insulating synthetic resin such as polyimide. The layer here is assumed to include a sheet, film or the like. The protective insulating layer 60 overlaps the electrodes and is provided on the first main surface S1 of the piezoelectric substrate 51. In the embodiment, the protective insulating layer 60 overlaps the gap G1 between the first electrode portion 54a and the fifth electrode portion 56a, an end portion on the gap G1 side of the first electrode portion 54a, and an end portion on the gap G1 side of the fifth electrode portion 56a. The protective insulating layer 60 covers the gap G1 and the electrode end portions throughout the lengths in the width direction Y.

As shown in FIGS. 5, 7 and 8, the piezoelectric element 50 configured as described above is arranged on the mounting portion 62 in a state where the first main surface S1 side of the piezoelectric substrate 51 faces the mounting portion 62 of the flexure 40 and in a state where the first electrode portion 54a of the first electrode 54 faces the first connecting pad 70a and the fifth electrode portion 56a of the second electrode 56 faces the second connecting pad 70b. The first electrode portion 54a is electrically and mechanically connected to the first connecting pad 70a by a conductive adhesive material Ad provided between the first electrode portion 54a and the first connecting pad 70a. Since the end portion of the first electrode portion 54a and the end portion of the fifth electrode portion 56a are covered with the protective insulating layer 60, the conductive adhesive material Ad will not contact the fifth electrode portion 56a, that is, the second electrode 56, and the first electrode 54 and the second electrode 56 will not be shorted. On the other hand, the fifth electrode portion 56a is electrically and mechanically connected to the second connecting pad 70b by a conductive adhesive material Ad provided between an end portion on the side surface SS2 side of the fifth electrode portion 56a and the second connecting pad 70b.

Consequently, the piezoelectric element 50 is mounted on the mounting portion 62 of the flexure 40, and is connected to the driving wiring lines 45b via the first connecting pad 70a and the second connecting pad 70b. The piezoelectric element 50 is arranged such that the longitudinal direction X extends substantially parallel to the central axis C of the suspension 34.

For example, the second electrode 56 is connected to a ground via the second connecting pad 70b. A driving voltage is applied to the first electrode 54 via the driving wiring line 45b and the first connecting pad 70a. When the driving voltage is applied, a voltage is applied between the third electrode portion 54c of the first electrode 54 and the fifth electrode portion 56a of the second electrode 56, and acts on the piezoelectric substrate 51 located between these electrode portions. When the voltage is applied, the piezoelectric substrate 51 expands and contracts in the longitudinal direction. Along with the expansion and contraction of the piezoelectric substrate 51, the piezoelectric substrate 51 deforms to curve or sag. However, the curve or sag is suppressed by the confining layer 52, and the piezoelectric substrate 51 is confined to a flat state. Consequently, the amount of expansion and contraction, that is, the amount of operation in the longitudinal direction X of the piezoelectric substrate 51 can be secured.

As shown in FIG. 4, as two piezoelectric elements 50 are driven such that these piezoelectric elements 50 expand and contract in opposite directions, the pair of first bridge portions 47c make strokes in opposite directions. The first bridge portions 47c oscillate the tongue portion 36a of the gimbal portion 36 and the magnetic head 17 via the handles 36f in directions indicated by an arrow D around the dimple 48. Consequently, the magnetic head 17 can be minutely displaced by the operation of expansion and contraction of the piezoelectric element 50 of the microactuator. By controlling the driving voltage supplied to the piezoelectric element 50, the magnetic head 17 is displaced in the cross-track direction (seek direction) and can be positioned with high accuracy.

In the head suspension assembly and microactuator configured as described above, the amount of operation or the amount of expansion and contraction of the piezoelectric element 50 increases as the region of the piezoelectric substrate 51 to which the voltage is applied increases, that is, the length and width of the region of the piezoelectric substrate 51 sandwiched between the third electrode portion 54c and the fifth electrode portion 56a increases. In FIG. 4, if the length of the piezoelectric substrate region sandwiched between the third electrode portion 54c and the fifth electrode portion 56a is assumed to be an active length AL, the amount of operation of the piezoelectric element 50 can be increased as the active length AL is increased. According to the embodiment, since the end portion of the fifth electrode portion 56a is covered with the protective insulating layer 60 and the short circuit between the fifth electrode portion 56a and the first electrode portion 54a is thereby prevented, the end of the fifth electrode portion 56a can be extended to a position close to the first side surface SS1. Consequently, the active length AL can be increased, and the amount of operation of the piezoelectric element 50, that is, the displacement stroke can be increased. As the displacement stroke is increased, the amount of displacement of the magnetic head by the microactuator can be increased. As a result, a high-accuracy positioning range in which positioning can be performed with high accuracy can be increased.

As described above, according to the embodiment, a microactuator, a head suspension assembly and a disk device which can increase the amount of operation of a piezoelectric element while preventing a short circuit in a connecting portion can be obtained.

Although the piezoelectric element 50 comprises the confining layer 52 in the above-described embodiment, the piezoelectric element 50 is not limited to this example and may not comprise any confining layer. In addition, the confining layer is not necessarily a single layer and may be formed of a plurality of confining layers stacked one on top of another. In addition, the shape and installation position of the protective insulating layer 60 and the shapes of the electrodes are not limited to those of the above-described embodiment and can be selected from various modes. The mounting position of the piezoelectric element 50 is not limited to that of the above-described embodiment and can be appropriately changed. For example, the piezoelectric element 50 can be provided beside the magnetic head or immediately behind the magnetic head. The piezoelectric element 50 is not necessarily installed in a direction parallel to the central axis of the suspension, and may be installed in a direction crossing the central axis.

Modification examples of the piezoelectric element and the protective insulating layer will be described below. In the following modification examples, the same portions as those of the above-described embodiment will be denoted by the same reference numbers, and detailed description thereof will be omitted or simplified.

First Modification Example

Figure 9:
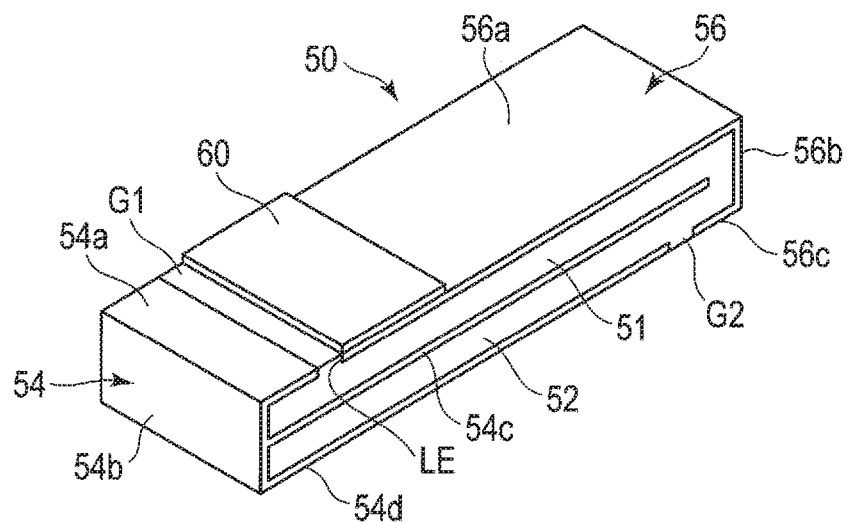
FIG. 9 is a perspective view showing a piezoelectric element of an HDD according to the first modification example.
Figure 10:
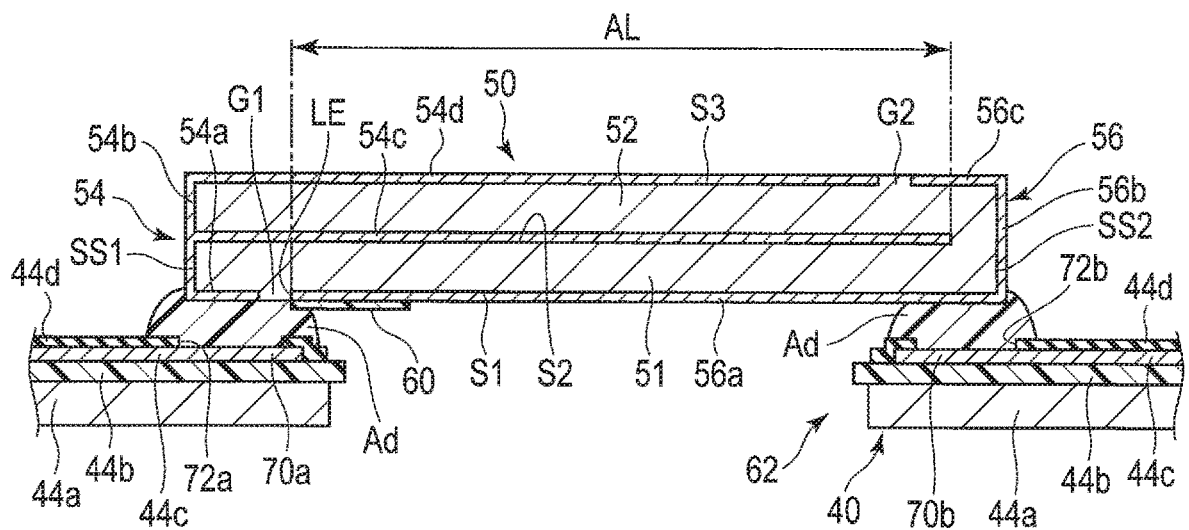
FIG. 10 is a cross-sectional view showing a mounting portion and the piezoelectric element of the HDD according to the first modification example.

FIG. 9 is a perspective view showing the first main surface side of the piezoelectric element of the first modification example, and FIG. 10 is a cross-sectional view showing the piezoelectric element and the mounting portion of the first modification example.

As shown in FIGS. 9 and 10, according to the first modification example, the protective insulating layer 60 has a rectangular shape and has the same width as the first main surface S1, for example. The protective insulating layer 60 overlaps the electrode end portion on the gap G1 side of the fifth electrode portion 56a including the electrode end LE and is provided on the first main surface S1 of the piezoelectric substrate 51. The protective insulating layer 60 covers the electrode end LE on the gap G1 side of the fifth electrode portion 56a and a part of the gap G1. The protective insulating layer 60 covers the electrode end portion and the part of the gap G1 throughout the lengths in the width direction Y.

This protective insulating layer 60 can also reliably prevent the short circuit between the first electrode 54 and the second electrode 56 in the connecting portion connected to the first connecting pad 70a.

Second Modification Example

Figure 11:
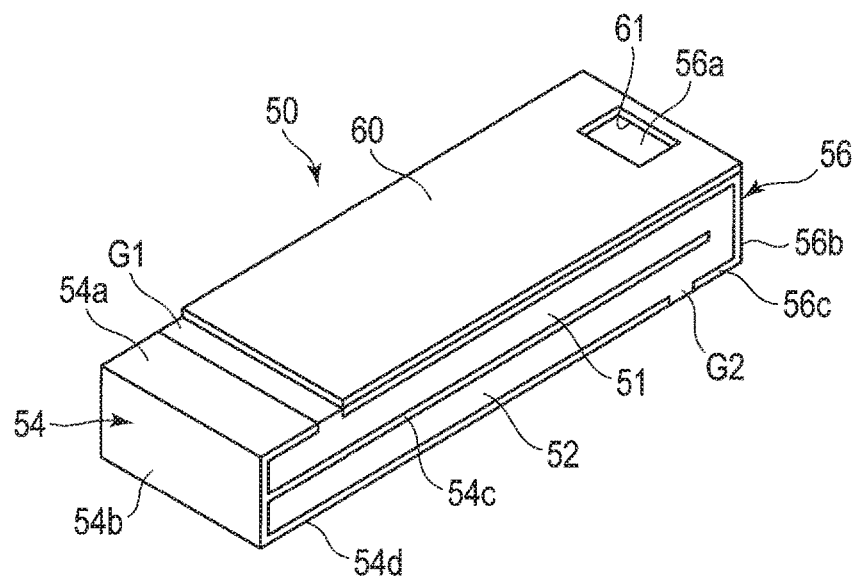
FIG. 11 is a perspective view showing a piezoelectric element of an HDD according to the second modification example.
Figure 12:
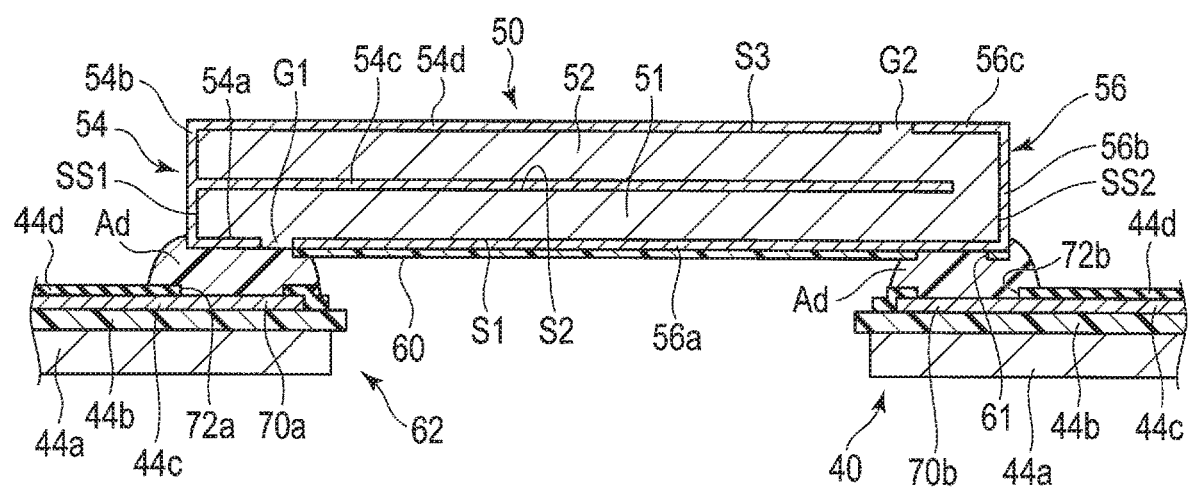
FIG. 12 is a cross-sectional view showing a mounting portion and the piezoelectric element of the HDD according to the second modification example.

FIG. 11 is a perspective view showing the first main surface side of the piezoelectric element of the second modification example, and FIG. 12 is a cross-sectional view showing the piezoelectric element and the mounting portion of the second modification example.

As shown in FIGS. 11 and 12, according to the second modification example, the protective insulating layer 60 has a rectangular shape and has the same width as the first main surface S1, for example. The protective insulating layer 60 overlaps the entire fifth electrode portion 56a and is provided on the first main surface S1 of the piezoelectric substrate 51. That is, the protective insulating layer 60 extends from an edge on the gap G1 side of the fifth electrode portion 56a to an edge on the second side surface SS2 side of the fifth electrode portion 56a. Furthermore, the protective insulating layer 60 covers an edge on the fifth electrode portion 56a side of the gap G1. The protective insulating layer 60 has an opening 61 in its end portion on the second side surface SS2 side. A part of the fifth electrode portion 56a is exposed through the opening 61.

As shown in FIG. 12, the first electrode portion 54a is electrically and mechanically connected to the first connecting pad 70a by the conductive adhesive material Ad provided between the first electrode portion 54a and the first connecting pad 70a. Since the end portion of the first electrode portion 54a and the end portion of the fifth electrode portion 56a are covered with the protective insulating layer 60, the conductive adhesive material Ad will not contact the fifth electrode portion 56a, that is, the second electrode 56, and the first electrode 54 and the second electrode 56 will not be shorted. The fifth electrode portion 56a of the second electrode 56 is electrically and mechanically connected to the second connecting pad 70b by the conductive adhesive material Ad provided between the end portion on the side surface SS2 side of the fifth electrode portion 56a and the second connecting pad 70b. The conductive adhesive material Ad is also provided in the opening 61 and is bonded to the fifth electrode portion 56a through the opening 61.

The protective insulating layer 60 configured as described above can also reliably prevent the short circuit between the first electrode 54 and the second electrode 56 in the connecting portion connected to the first connecting pad 70a. In addition, when the conductive adhesive material Ad is provided in the opening 61, the adhesion strength of the adhesive can be improved by an anchor effect.

Note that the number of openings 61 is not limited to one and a plurality of openings may be formed. In addition, the shape of the opening 61 is not limited to a rectangular shape and can be selected from various other shapes.

Third Modification Example

Figure 13:
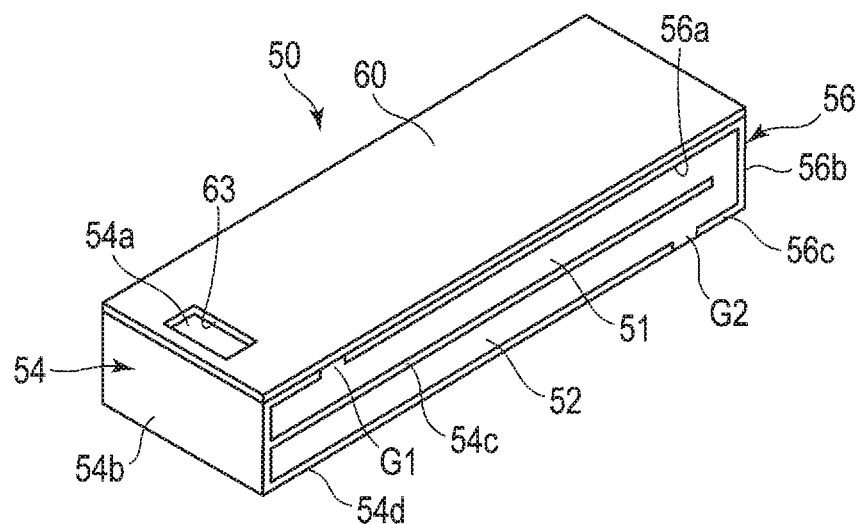
FIG. 13 is a perspective view showing a piezoelectric element of an HDD according to the third modification example.
Figure 14:
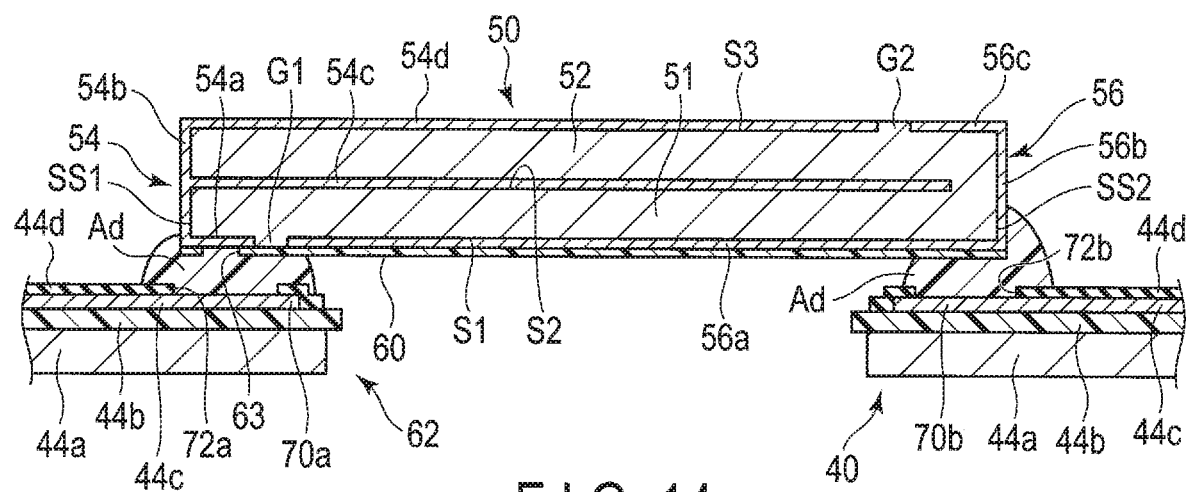
FIG. 14 is a cross-sectional view showing a mounting portion and the piezoelectric element of the HDD according to the third modification example.

FIG. 13 is a perspective view showing the first main surface side of the piezoelectric element of the third modification example, and FIG. 14 is a cross-sectional view showing the piezoelectric element and the mounting portion of the third modification example.

As shown in FIGS. 13 and 14, according to the third modification example, the protective insulating layer 60 has a rectangular shape and has the same width as the first main surface S1, for example. The protective insulating layer 60 overlaps the entire first electrode portion 54a, the gap G1 and the entire fifth electrode portion 56a, and is provided on the first main surface S1 of the piezoelectric substrate 51. That is, the protective insulating layer 60 extends from an edge on the first side surface SS1 side of the first electrode portion 54a to an edge on the second side surface SS2 side of the fifth electrode portion 56a and covers the entire first main surface S1. In addition, the protective insulating layer 60 has an opening 63 in its end portion on the first side surface SS1 side. A part of the first electrode portion 56a is exposed through the opening 63.

As shown in FIG. 14, the first electrode portion 54a is electrically and mechanically connected to the first connecting pad 70a by the conductive adhesive material Ad provided between the first electrode portion 54a and the first connecting pad 70a. The conductive adhesive material Ad is also provided in the opening 63 and is bonded to the first electrode portion 54a through the opening 63. In addition, since the first electrode portion 54a, the gap G1 and the fifth electrode portion 56a are covered with the protective insulating layer 60, the conductive adhesive material Ad will not contact the fifth electrode portion 56a, that is, the second electrode 56, and the first electrode 54 and the second electrode 56 will not be shorted.

The second electrode 56 is electrically and mechanically connected to the second connecting pad 70b by the conductive adhesive material Ad provided between the fifth electrode portion 56a and sixth electrode portion 56b, and the second connecting pad 70b. That is, the conductive adhesive material Ad is bonded to and is electrically continuous with the sixth electrode portion 56b.

The protective insulating layer 60 configured as described above can also reliably prevent the short circuit between the first electrode 54 and the second electrode 56 in the connecting portion connected to the first connecting pad 70a. In addition, when the conductive adhesive material Ad is provided in the opening 63, the adhesion strength of the adhesive can be improved by an anchor effect.

Note that the number of openings 63 is not limited to one and a plurality of openings may be formed. In addition, the shape of the opening 63 is not limited to a rectangular shape and can be selected from various other shapes.

Fourth Modification Example

Figure 15:
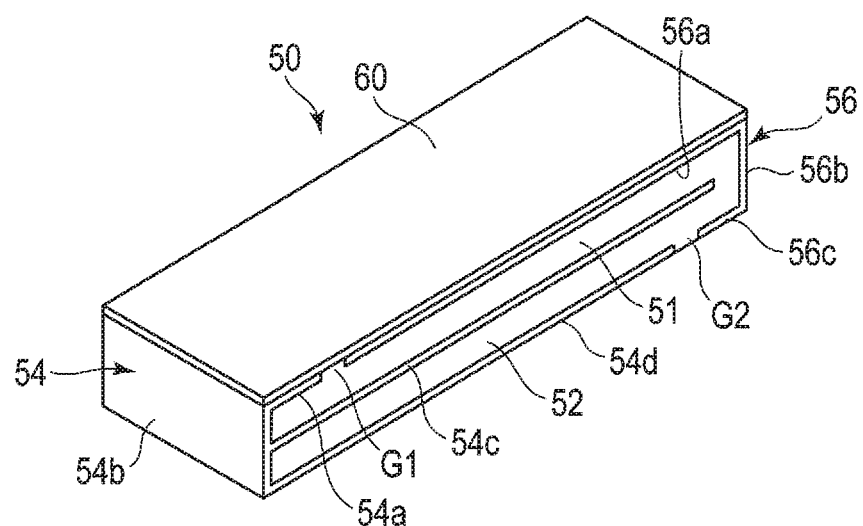
FIG. 15 is a perspective view showing a piezoelectric element of an HDD according to the fourth modification example.
Figure 16:
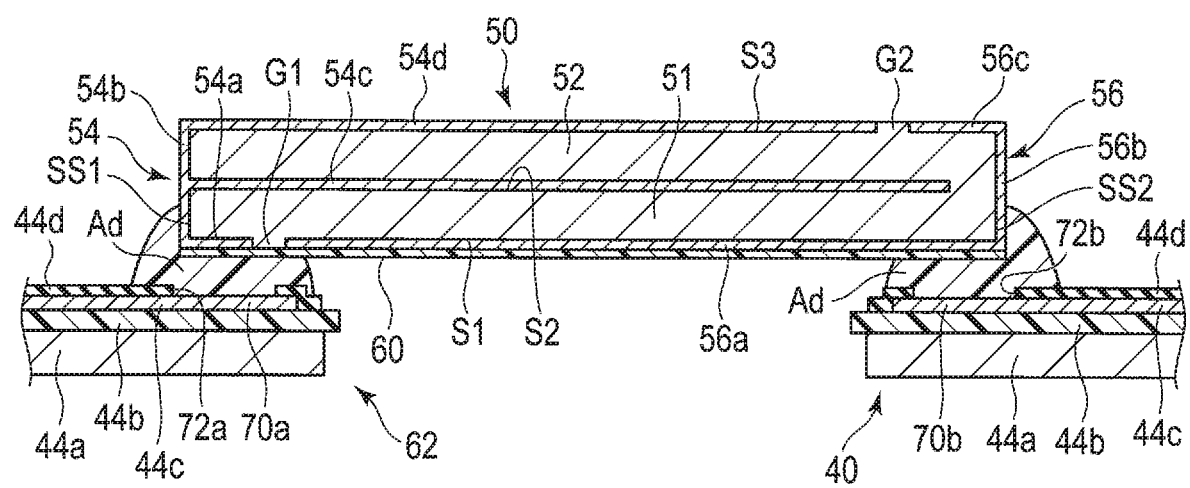
FIG. 16 is a cross-sectional view showing a mounting portion and the piezoelectric element of the HDD according to the fourth modification example.

FIG. 15 is a perspective view showing the first main surface side of the piezoelectric element of the fourth modification example, and FIG. 16 is a cross-sectional view showing the piezoelectric element and the mounting portion of the fourth modification example.

As shown in FIGS. 15 and 16, according to the fourth modification example, the protective insulating layer 60 has a rectangular shape and has the same width as the first main surface S1, for example. The protective insulating layer 60 overlaps the entire first electrode portion 54a, the gap G1 and the entire fifth electrode portion 56a, and is provided on the first main surface S1 of the piezoelectric substrate 51. That is, the protective insulating layer 60 extends from an edge on the first side surface SS1 side of the first electrode portion 54a to an edge on the second side surface SS2 side of the fifth electrode portion 56a and covers the entire first main surface S1.

As shown in FIG. 16, the first electrode 54 is electrically and mechanically connected to the first connecting pad 70a by the conductive adhesive material Ad provided between the first electrode portion 54a and second electrode portion 54b, and the first connecting pad 70a. That is, the conductive adhesive material Ad is bonded to and is electrically continuous with the second electrode portion 54b. Since the first electrode portion 54a, the gap G1 and the fifth electrode portion 56a are covered with the protective insulating layer 60, the conductive adhesive material Ad does not contact the fifth electrode portion 56a, that is, the second electrode 56, and the first electrode 54 and the second electrode 56 will not be shorted.

The second electrode 56 is electrically and mechanically connected to the second connecting pad 70b by the conductive adhesive material Ad provided between the fifth electrode portion 56a and sixth electrode portion 56b, and the second connecting pad 70b. That is, the conductive adhesive material Ad is bonded to and is electrically continuous with the second electrode portion 56b.

The protective insulating layer 60 configured as described above can more reliably prevent the short circuit between the first electrode 54 and the second electrode 56 in the connecting portion connected to the first connecting pad 70a.

Fifth Modification Example

FIG. 17 is a perspective view showing the first main surface side of the piezoelectric element of the fifth modification example.

As illustrated, according to the fifth modification example, the length of the first electrode portion 54a of the first electrode 54 is less than or equal to half the width of the first main surface S1 in the width direction of the first main surface S1. The fifth electrode portion 56a of the second electrode 56 extends from an edge on the first side surface SS1 side to an edge on the second side surface SS2 side. About a half in the width direction of an electrode end portion 57 on the first side surface SS1 side of the fifth electrode portion 56a is cut out. Consequently, the electrode end LE of the fifth electrode portion 56a faces an edge of the first electrode portion 54a in the substantially L-shaped gap G1.

The protective insulating layer 60 has a rectangular shape and has the same width as the first main surface S1, for example. The protective insulating layer 60 overlaps the entire first electrode portion 54a, the gap G1 and the entire fifth electrode portion 56a, and is provided on the first main surface S1 of the piezoelectric substrate 51. That is, the protective insulating layer 60 covers the entire first main surface S1. In addition, the protective insulating layer 60 has a first opening 64a and a second opening 64b in its end portion on the first side surface SS1 side. The first opening 64a faces the first electrode portion 54a, and a part of the first electrode portion 54a is exposed at the first opening 64a. The second opening 64b faces an end portion of the fifth electrode portion 56a, and a part of the fifth electrode portion 56a is exposed at the second opening 64b.

According to the above-described piezoelectric element 50, a connecting portion of the first electrode 54 and a connecting portion of the second electrode 56 are arranged side by side in one end portion in the longitudinal direction of the first main surface S1. Therefore, in the mounting portion of the flexure, when the first connecting pad and the second connecting pad are arranged in the width direction of the flexure, the first electrode 54 and the second electrode 56 can also be electrically and mechanically connected to the first connecting pad and the second connecting pad by the conductive adhesive material through the first opening 64a and the second opening 64b, respectively. In this case also, since the portion between the first opening 64a and the second opening 64b is covered with the protective insulating layer 60, the first electrode and the second electrode will not be shorted by the conductive adhesive material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, although the pair of piezoelectric elements 50 are mounted on the gimbal portion 36 of the flexure and are located on the proximal end side of the load beam 35 with respect to the magnetic head 17 in the above-described embodiment, the configuration is not limited to this example. For example, the piezoelectric elements may be arranged on both sides in the width direction of the supporting portion (tongue portion) which supports the magnetic head and may be arranged alongside the magnetic head. Instead of the pair of piezoelectric elements, for example, a single piezoelectric element may be used. The piezoelectric element is not necessarily arranged such that its longitudinal direction (expansion/contraction direction) is substantially parallel to the central axis of the suspension, and may be arranged such that its longitudinal direction extends in a direction crossing the central axis. The shape of the connecting pad of the mounting portion is not limited to a rectangular shape, and can be selected from various other shapes such as an elliptical shape, a circular shape and a polygonal shape.

What is claimed is:

1. A microactuator comprising:
a wiring substrate comprising a first connecting pad and a second connecting pad; and
a piezoelectric element mounted on the wiring substrate and connected to the first connecting pad and the second connecting pad, wherein
the piezoelectric element comprises
a piezoelectric substrate formed of a piezoelectric material and comprising a first main surface, a second main surface opposing the first main surface, and a first side surface and a second side surface opposing each other,
a first electrode comprising a first electrode portion provided in an end portion on a first side surface side on the first main surface, a second electrode portion provided on the first side surface, and a third electrode portion provided on the second main surface,
a second electrode comprising a fifth electrode portion which has an electrode end facing the first electrode portion across a gap, is provided on the first main surface, and opposes the third electrode portion via the piezoelectric substrate, and a sixth electrode portion provided on the second side surface, and
a protective insulating layer provided on the first main surface and covering an end portion of the fifth electrode portion including the electrode end, the gap between the electrode end of the fifth electrode portion and the first electrode portion on the first main surface, and an end portion on a gap side of the first electrode portion,
the piezoelectric element is arranged such that the first main surface faces the wiring substrate, and
the first electrode and the second electrode are connected to the first connecting pad and the second connecting pad, respectively, by a conductive adhesive material, the protective insulating layer being in contact with the conductive adhesive material at a first surface of the protective insulating layer opposite a second surface of the protective insulating layer covering the gap.

2. The microactuator of claim 1, wherein
the first electrode portion is connected to the first connecting pad by the conductive adhesive material, and
an end portion on a second side surface side of the fifth electrode portion is connected to the second connecting pad by the conductive adhesive material.

3. The microactuator of claim 1, wherein
the protective insulating layer overlaps an entire surface of the fifth electrode portion including the electrode end, and having an opening facing the end portion on the second side surface of the fifth electrode portion,
the first electrode portion is connected to the first connecting pad by the conductive adhesive material, and
the end portion on the second side surface side of the fifth electrode portion is connected to the second connecting pad through the opening by the conductive adhesive material.

4. The microactuator of claim 1, wherein
the protective insulating layer covers the first electrode portion, the gap, and the fifth electrode portion, and having an opening facing the first electrode portion,
the first electrode portion is connected to the first connecting pad through the opening by the conductive adhesive material, and
the sixth electrode portion is connected to the second connecting pad by the conductive adhesive material.

5. The microactuator of claim 1, wherein
the protective insulating layer covers the first electrode portion, the gap and the fifth electrode portion,
the second electrode portion is connected to the first connecting pad by the conductive adhesive material, and
the sixth electrode portion is connected to the second connecting pad by the conductive adhesive material.

6. The microactuator of claim 1, wherein
the fifth electrode portion includes an electrode end portion arranged alongside the first electrode portion on the first main surface, and the electrode end portion faces the first electrode portion across a gap, the protective insulating layer covers the first electrode portion, the gap and the fifth electrode portion, and the protective insulating layer has a first opening facing the first electrode portion, and a second opening facing the electrode end portion of the fifth electrode portion.

7. The microactuator of claim 1, wherein
the piezoelectric element further comprises a confining layer overlapping the second main surface and the third electrode portion.

8. A head suspension assembly comprising:
a supporting plate;
a wiring substrate provided on the supporting plate;
the microactuator of claim 1 comprising the piezoelectric element mounted on the wiring substrate; and
a magnetic head mounted on the wiring substrate.

9. A disk device comprising:
a disk-shaped recording medium; and
the head suspension assembly of claim 8 supporting the magnetic head.

* * * * *